United States Patent
Gebhardt et al.

(10) Patent No.: US 9,696,394 B2
(45) Date of Patent: Jul. 4, 2017

(54) MAGNETIC RESONANCE SYSTEM HAVING VARIABLE FREQUENCY TRANSMIT PULSES

(75) Inventors: Matthias Gebhardt, Erlangen (DE); Josef Pfeuffer, Kunreuth (DE); Thorsten Speckner, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 986 days.

(21) Appl. No.: 13/569,034

(22) Filed: Aug. 7, 2012

(65) Prior Publication Data

US 2013/0038329 A1 Feb. 14, 2013

(30) Foreign Application Priority Data

Aug. 8, 2011 (DE) .................. 10 2011 080 604

(51) Int. Cl.
*G01R 33/36* (2006.01)
(52) U.S. Cl.
CPC ................. *G01R 33/3607* (2013.01)
(58) Field of Classification Search
CPC .................................................. G01R 33/3607
See application file for complete search history.

(56) References Cited

U.S. PATENT DOCUMENTS

| | | | |
|---|---|---|---|
| 3,975,675 A * | 8/1976 | Dunand et al. ............... | 324/312 |
| 4,673,880 A * | 6/1987 | Compton et al. ............. | 324/309 |
| 4,706,023 A * | 11/1987 | Den Boef ..................... | 324/309 |
| 4,991,587 A | 2/1991 | Blakeley et al. | |
| 5,166,620 A * | 11/1992 | Panosh ......................... | 324/322 |
| 5,212,448 A * | 5/1993 | Le Roux et al. ............. | 324/309 |
| 5,436,600 A | 7/1995 | Van Heteren et al. | |

(Continued)

FOREIGN PATENT DOCUMENTS

| | | |
|---|---|---|
| CN | 101879074 A | 11/2010 |
| CN | 102048539 A | 5/2011 |

(Continued)

OTHER PUBLICATIONS

Bernstein, Matt A., Kevin F. King, and Xiaohong Joe Zhou. Handbook of MRI pulse sequences. Elsevier, pp. 192-197; 2004.

(Continued)

*Primary Examiner* — Dixomara Vargas
(74) *Attorney, Agent, or Firm* — Lempia Summerfield Katz LLC

(57) ABSTRACT

A controller of a magnetic resonance system outputs a low frequency base signal to a conversion device. While outputting the base signal to the conversion device, the controller outputs an oscillator control signal to an oscillator. The oscillator outputs a frequency signal corresponding to the oscillator control signal to the conversion device. The conversion device converts the frequency signal into a high frequency transmit pulse with the aid of the base signal and outputs the transmit pulse to a magnetic resonance transmit antenna. The magnetic resonance transmit antenna applies a high frequency field corresponding to a transmit pulse to an examination volume of the magnetic resonance system. The controller varies the oscillator control signal output to the oscillator while outputting the base signal to the modulator. The transmit pulse) has a larger bandwidth than the base signal.

16 Claims, 6 Drawing Sheets

(56) References Cited

U.S. PATENT DOCUMENTS

| | | | |
|---|---|---|---|
| 7,633,293 B2 * | 12/2009 | Olson et al. | 324/318 |
| 2009/0091394 A1 | 4/2009 | Friedrich | |
| 2009/0096546 A1 | 4/2009 | Demharter et al. | |
| 2011/0109316 A1 | 5/2011 | Akita et al. | |

FOREIGN PATENT DOCUMENTS

| | | |
|---|---|---|
| DE | 102007048167 A1 | 4/2009 |
| DE | 102007058872 A1 | 4/2009 |
| JP | S6434342 A | 2/1989 |
| WO | WO2012034088 A1 | 3/2012 |

OTHER PUBLICATIONS

Chinese office Action for related Chinese Application No. 201210280088.8 dated Sep. 8, 2015, with English Translation.

German office Action for related German Application No. 10 2011 080 604.0 dated Aug. 8, 2012, with English Translation.

Setsompop, K., et al: "Magnitude least squares optimization for parallel radio frequency excitation design demonstrated at 7 Tesla with eight channels", in: Magn Reson Med., vol. 59, Nr. 4, pp. 908-15, 2008.

Shenghao, B., et.al.: "Data Processing and Image Reconstruction Technology in the Magnetic Resonance Imaging System", in: Biomedicine Engineering Journal, vol. 13, Nr. 4, pp. 328-332, 1996.

* cited by examiner

MAGNETIC RESONANCE SYSTEM HAVING VARIABLE FREQUENCY TRANSMIT PULSES

This application claims the benefit of DE 10 2011 080 604.0, filed on Aug. 8, 2011.

BACKGROUND

The present embodiments relate to an operating method for a magnetic resonance system.

Magnetic resonance systems use real-time controllers in a transmit chain in order to keep a high frequency amplitude of a transmit pulse constant. Controllers of this type may use a signal present at a radio frequency power amplifier (RFPA) output as a control variable. The signal is down-mixed to the base band. A signal is modified as an actuating variable. The signal is likewise in the base band range.

The bandwidth of controllers of this type may be restricted. Bandwidths may lie at approximately 100 kHz. This is sufficient to output amplitude-modulated high frequency (HF) pulses (e.g., with bandwidths in the range of a few kHz) in a distortion-free manner. Frequency offsets in the range of up to 250 kHz are, however, provided for the off-center excitation. Frequency shifts of this type are realized by an oscillator. The oscillator outputs a correspondingly varied frequency signal. The frequency offset is therefore transparent for the control process.

The modulation also takes place in the base band in the case of frequency-modulated pulses. If the bandwidth of the HF pulse resulting herefrom is larger than the controller bandwidth, the pulses are either no longer output in a distortion-free manner or the controller is shut down. One example of a pulse of this type is the hyperbolic secant (HS) pulse. A further example is the frequency offset corrected inversion (FOCI) pulse.

SUMMARY AND DESCRIPTION

One problem occurs, for example, if several magnetic resonance antennas are to be operated simultaneously, if array operation is to take place because dynamic pulses for transmit arrays may include high bandwidths. In magnetic resonance systems with controllers, pulses of this type may not be output correctly or may be output correctly to a limited degree.

In the prior art, transmit pulses with a bandwidth that is larger than the controller bandwidth are not used. Instead, only the bandwidth of the HS pulse may be restricted, or pulses with an excessively high bandwidth may not be used.

The present embodiments may obviate one or more of the drawbacks or limitations in the related art. For example, pulses with high bandwidths, although the base signal has a minimal bandwidth, are provided.

In one embodiment, a controller varies an oscillator control signal output to an oscillator during the output of a base signal to a modulator. A transmit pulse has a larger bandwidth than the base signal.

The base pulse p'(t) and/or the transmit pulse P'(t), which is equivalent hereto, may be regarded as a function of the time (t) as a product of two parts (e.g., an amplitude-modulated part p(t) (base signal) and a frequency and/or phase-modulated part $s=\exp(i\Phi(t))$ (frequency signal)). The modulation is determined by an oscillator control signal $\Phi(t)$.

Two parameters therefore exist (e.g., the base signal and the oscillator control signal) in order to achieve the same result (e.g., the transmit pulse). The parameter "oscillator control signal" may be varied in order to provide that the bandwidth of the base signal is smaller than the bandwidth of the transmit pulse.

The transmit pulse may be generated in two stages. In one embodiment, the base signal and the frequency signal are fed to a modulator within a conversion device. The modulator modulates the frequency signal to a high frequency base pulse with the aid of the basis signal and outputs the base pulse within the conversion device to a power amplifier. The power amplifier amplifies the base pulse to the transmit pulse.

The controller may control a frequency of the frequency signal exclusively using the oscillator control signal. In another embodiment, the controller may exclusively control a phase position of the frequency signal using the oscillator control signal. The controller controls both variables using the oscillator control signal.

The transmit pulse may be generated in a purely controlled fashion. A control may take place, however. The controller may output the base signal as a target signal to a base controller. The power amplifier may output the transmit pulse to a demodulator and to the magnetic resonance transmit antenna. The oscillator may output the frequency signal to the demodulator and to the modulator. The demodulator may demodulate the transmit pulse to a lower frequency signal with the aid of the frequency signal. The demodulator may also output the low frequency signal as an actual signal to the base controller. The base controller may determine a low frequency control signal to be output to the modulator with the aid of the target signal and the actual signal. The base controller may also output the low frequency control signal to the modulator.

The base controller has a controller bandwidth. On account of one embodiment of a mode of operation (e.g., that the transmit pulse has a larger bandwidth than the base signal), the controller bandwidth may be larger than the bandwidth of the base signal. In contrast, the controller bandwidth may not be larger than the bandwidth of the transmit pulse. The controller bandwidth may instead be smaller than the bandwidth of the transmit pulse.

In one embodiment, the base signals and the oscillator control signals may be determined in advance. In this case, the base signals and the associated oscillator control signals may, for example, be stored in the controller so that the base signals and the associated oscillator control signals only have to be called up again. Alternatively, the controller may be predefined characteristics of a desired transmit pulse and limitations for possible base signals and/or limitations for a curve of the oscillator control signal. The controller may automatically determine the base signal and the curve of the oscillator control signal with the aid of the predetermined characteristics and limitations.

In one embodiment, the controller may be prescribed a set of basic curves of the oscillator control signal. The controller may determine the curve of the oscillator control signal as a linear combination of the basic curves. This embodiment minimizes the computing effort needed to determine the base signals and the associated oscillator control signal in each case.

The controller may vary the oscillator control signal in a continuous fashion. Alternatively, the variation may take place in stages. Alternatively or in addition, the controller may divide the outputting of the base signal to the modulator in several time segments of predetermined length or predetermined minimum length or may vary the oscillator control signal from time segment to time segment, while keeping the same constant within the time segments.

In one embodiment, one embodiment of a computer program is provided. The computer program is embodied such that the processing of machine code by the controller provides that the controller operates the magnetic resonance system in accordance with one embodiment of an operating method.

In another embodiment, a controller that is programmed such that the controller operates the magnetic resonance system in accordance with one embodiment of an operating method is provided.

In yet another embodiment, a magnetic resonance system, in which the controller is programmed to operate the magnetic resonance system in accordance with one embodiment of an operating method, is provided.

DETAILED DESCRIPTION OF THE DRAWINGS

Figure 1:
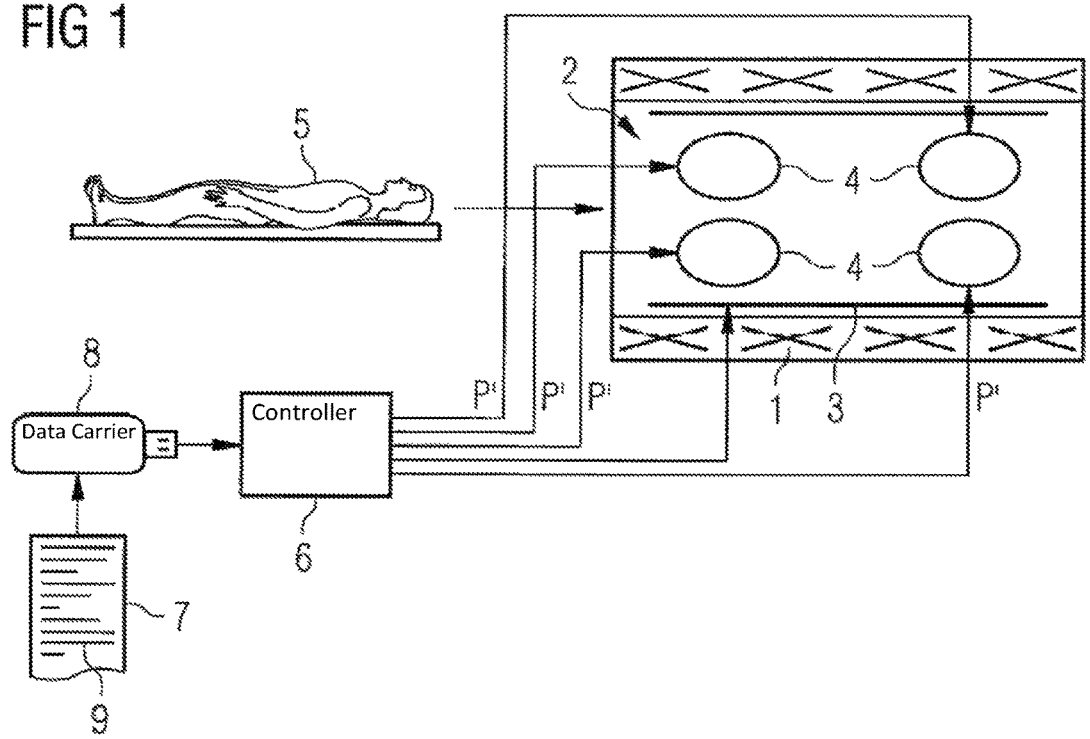
FIG. 1 shows one embodiment of a magnetic resonance system.

According to FIG. 1, one embodiment of a magnetic resonance system includes a base magnet 1. The base magnet 1 generates a temporally static and locally essentially homogenous base magnetic field in an examination volume 2 of the magnetic resonance system. A gradient magnetic system 3, using which a temporally static, but locally varying magnetic field may be superimposed on the base magnetic field, may also be present. If the gradient magnetic system 3 is available, the gradient magnetic system 3 may include three subsystems for varying the magnetic field in the three main directions.

The magnetic resonance system also includes at least one magnetic resonance antenna 4. In one embodiment, only one single magnetic resonance antenna 4 is provided (e.g., a whole body transmit antenna (body coil)). Alternatively, as shown in FIG. 1, several magnetic resonance transmit antennas 4 may be provided. The number of four magnetic resonance transmit antennas 4 shown in FIG. 1 is, however, exemplary.

The magnetic resonance transmit antennas 4 may alternatively be operated individually or simultaneously (e.g., within a transmit array). An examination object 5 that is introduced into the examination volume 2 may be excited to emit magnetic resonance signals using the magnetic resonance transmit antennas 4.

The magnetic resonance system is controlled by a control facility 6 (e.g., a control device or a controller). The controller 6 controls at least the magnetic resonance transmit antennas 4, the magnetic resonance receive antennas (not shown in FIG. 1) and, if available, the gradient magnetic system 3. The controller 6 may include further control functions and, if necessary, also perform an evaluation of received magnetic resonance signals.

The controller 6 is embodied as a software-programmable device. The functionality of the controller 6 is determined by a computer program 7, with which the controller 6 is programmed. The computer program 7 may be fed to the controller 6 by way of a data carrier 8 (e.g., a non-transitory computer-readable medium), for example, on which the computer program 7 is stored in a machine-readable form (e.g., exclusively). The computer program 7 includes machine code 9 having instructions that may be directly processed by the controller 6. The processing of the machine code 9 by the controller 6 provides that the controller 6 operates the magnetic resonance system according to an operating method that is described in more detail below in conjunction with FIG. 2.

Figure 2:
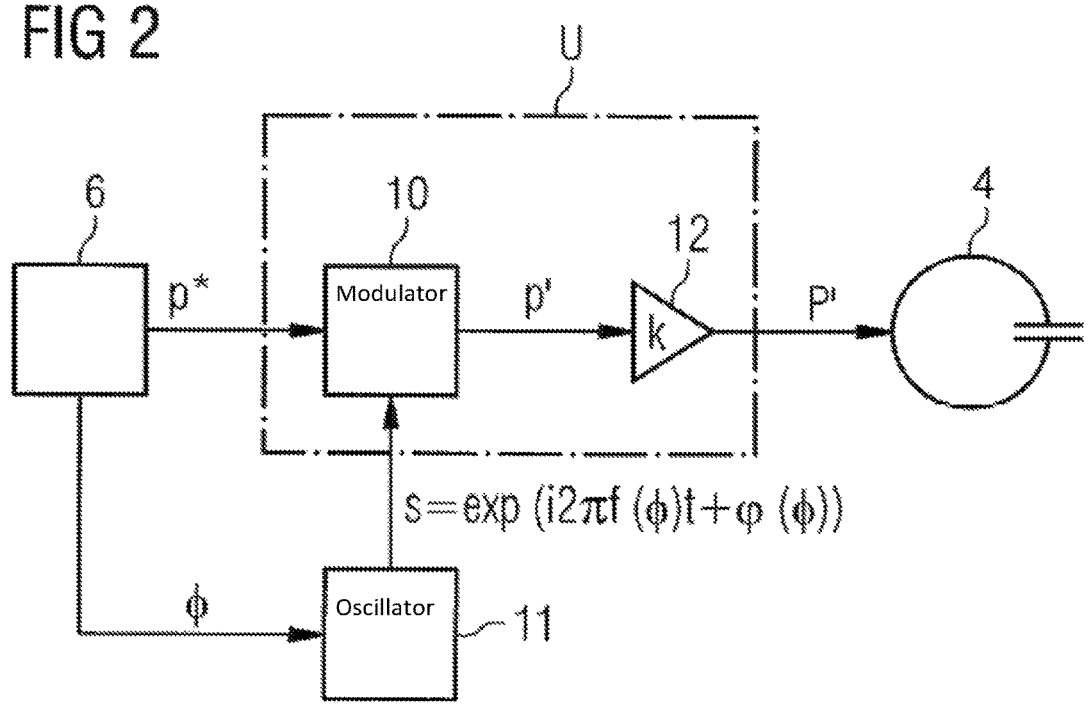
FIG. 2 shows one embodiment of a transmit channel.

FIG. 2 shows one embodiment of an individual transmit channel of the magnetic resonance system (e.g., a signal path from the controller 6 to the magnetic resonance transmit antenna 4 and/or in the event of several magnetic resonance transmit antennas 4, to one of the magnetic resonance transmit antennas 4 or a uniformly operating group of magnetic resonance transmit antennas 4).

According to FIG. 2, the controller 6 outputs a base signal p* to a conversion device U (e.g., a converter). The base signal p* is low frequency. The base signal p* has a relatively small bandwidth (e.g., 25 kHz).

The controller 6 also outputs an oscillator signal Φ to an oscillator 11. The oscillator 11 outputs a frequency signal s to the conversion device U. The frequency signal s corresponds with the oscillator control signal Φ.

The oscillator control signal Φ controls a frequency and/or a phase position of the frequency signal s, which the oscillator 11 outputs to the conversion device U. Outputting the oscillator control signal Φ to the oscillator 1 and the corresponding influence of the frequency signal s take place. The controller 6 outputs the base signal p* to the conversion device U.

The conversion device U accepts the base signal p* and the frequency signal s. The conversion device U converts the frequency signal s with the aid of the base signal p* (e.g., in the form of an amplitude modulation) into a transmit pulse P'. The transmit pulse P' is high frequency. For example, the transmit pulse P' has a frequency around the Larmor frequency of the magnetic resonance system. The conversion device U outputs the transmit pulse P' to the magnetic resonance transmit antenna 4. The magnetic resonance transmit antenna 4 applies an HF field that corresponds to the transmit pulse P' to the examination volume 2.

The conversion device U may internally include a modulator 10 and a power amplifier 12. The base signal p* and the frequency signal s are fed to the modulator 10 within the conversion device U. The modulator 10 modulates the frequency signal s with the aid of the base signal p* (e.g., in the form of an amplitude modulation) to form a base pulse p'. The base pulse p' is already high frequency. For example, similarly to the transmit pulse P', the base pulse p' already includes a frequency around the Larmor frequency of the magnetic resonance system. The modulator 10 outputs the base pulse p' to the power amplifier 12. The power amplifier 12 amplifies the base pulse p' about an amplification factor k to form the transmit pulse P'.

Figure 3:
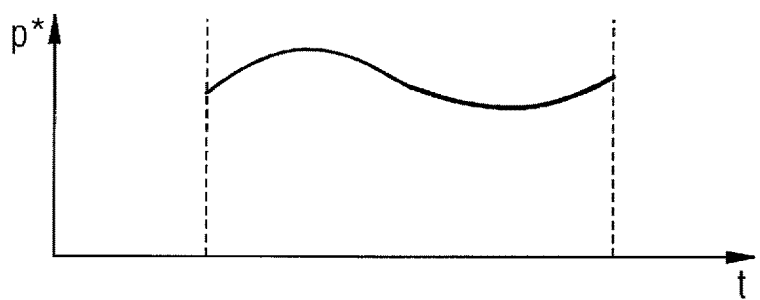
FIGS. 3 to 6 show exemplary time diagrams.
Figure 4:
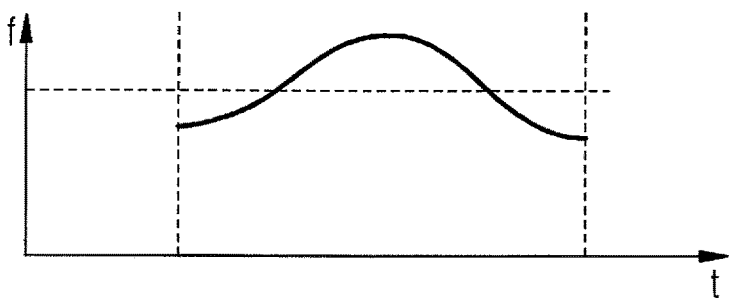
Figure 5:
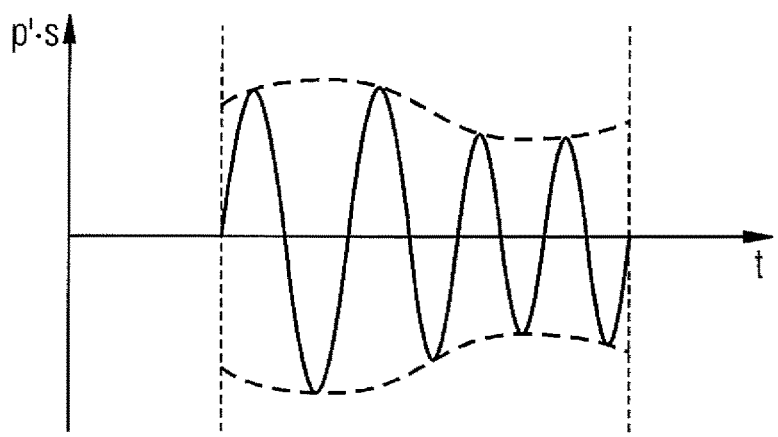
Figure 6:
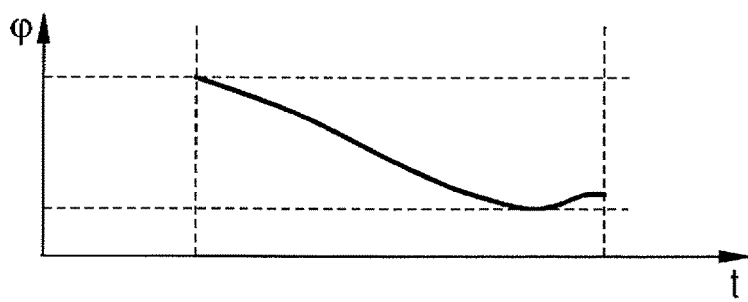

Contrary to the prior art, while the controller 6 outputs the base signal p* to the modulator 10 (see FIG. 3), the oscillator control signal Φ, as a function of time t, is not kept constant but is varied by the controller 6 (see FIGS. 4, 5 and 6). For example, the controller 6 may control the frequency f (see FIGS. 4 and 5) and/or the phase position φ (see FIG. 6) of the frequency signal s during the respective transmit pulse P'. The transmit pulse P' (and with the transmit pulse P', the base pulse p') may have a larger bandwidth than the base signal p*. The transmit pulse P' may, for example, have a bandwidth of approx. 150 kHz.

The transmit pulse P' may only be generated, according to the previous explanations in FIG. 2, in a controlled fashion, and the transmit pulse P' may be output to the magnetic resonance antenna 4. Control of the amplitude of the transmit pulse P' may take place according to the representation in FIG. 7.

Figure 7:
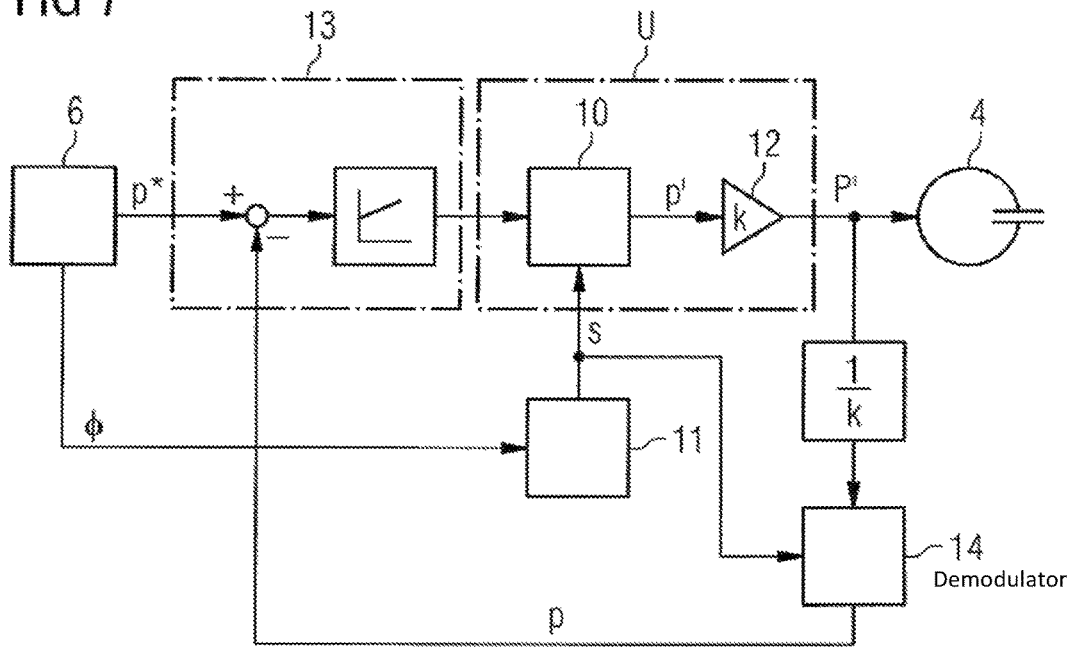
FIG. 7 shows one embodiment of a transmit channel.

FIG. 7 is based on FIG. 2. The matching elements therefore will not be explained again. A base controller 13 and a demodulator 14 are provided. The base controller 13 may, if necessary, be embodied, for example, as a P controller, a PI controller, a PT1 controller, or another controller. The base controller 13 may have, for example, a controller bandwidth (e.g., 100 kHz). The demodulator 14 operates inversely to the modulator 10.

According to FIG. 7, the controller 6 outputs the base signal p* as a target signal to the base controller 13. The power amplifier 12 outputs the transmit pulse P' (and/or a fraction of the transmit pulse P') to the demodulator 14. The power amplifier 12 outputs the signal pulse P' to both the magnetic resonance antenna 14 and to the demodulator 14.

The oscillator 11 also outputs the frequency signal s to the modulator 10. In addition, the oscillator 1 outputs the frequency signal s to the demodulator 14. The demodulator 14 demodulates the transmit pulse P' with the aid of the frequency signal s to form a low frequency signal p. The low frequency signal p outputs the demodulator 14 as an actual signal to the base controller 13. The base controller 13 is therefore able to determine a control signal with the aid of the target signal and the actual signal and output the control signal to the modulator 10. The control signal is, similarly to the base signal p*, low frequency.

The controller bandwidth is to be larger than the bandwidth of the base signal p*. The controller bandwidth may also be larger than the bandwidth of the transmit pulse P'. In one embodiment, the controller bandwidth is smaller than the bandwidth of the transmit pulse P. The controller bandwidth may lie at approximately 100 kHz, for example.

Figure 8:
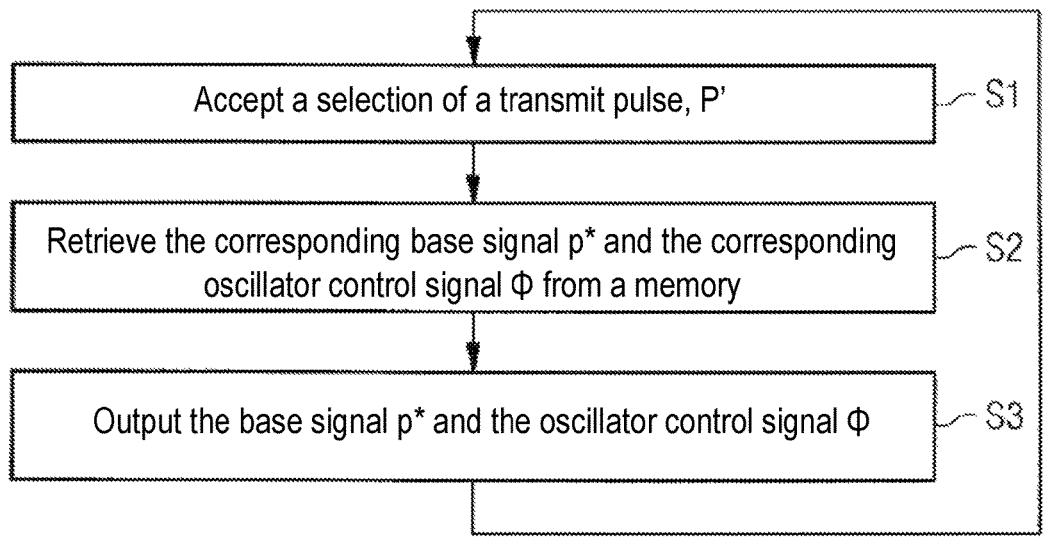
FIGS. 8 to 10 show flow charts of embodiments of methods of operating a magnetic resonance system.

In one embodiment, the permissible combinations of base signals p* and oscillator control signals Φ may be permanently stored in advance within the controller 6 during the respective base signal p*. In this case (see FIG. 8), the controller 6 in act S1 accepts a selection of a transmit pulse to be output. In act S2, the controller 6 calls up the corresponding base signal p* and the corresponding oscillator control signal Φ from an internal memory (not shown). In act S3, the controller 6 outputs the base signal p* and the oscillator control signal Φ to the corresponding components 10, 11.

In another embodiment, the controller 6 may determine the respective base signal p* and the corresponding oscillator control signal Φ. In this case, in act S11, characteristics of the desired transmit pulse are prescribed to the controller 6 according to FIG. 9. The controller 6 accepts the corresponding characteristics in act S11.

In act S12, limitations for possible base signals p* are prescribed to the controller 6. For example, the controller 6 may be prescribed a maximum permissible bandwidth or a maximum permissible amplitude. Alternatively, the controller 6 may be prescribed the corresponding limitation in advance.

Alternatively or in addition to act S12, the controller 6 in act S13 may be prescribed limitations for the oscillator control signal Φ (e.g., a maximum change in speed or a minimum permissible and/or maximum permissible value). Alternate points in time or characteristic restrictions may also be predetermined. The corresponding limitations of the controller 6 may alternatively also be given in advance.

The controller 6 determines the base signal p* and the oscillator control signal Φ. For example, in act S14, the controller 6 according to FIG. 9 may initially determine a curve of the oscillator control signal Φ. The controller 6 naturally takes the limitations of the oscillator control signal Φ into account within the scope of act S14.

The controller 6, in act S15, may determine the associated curve of the base signal p* with the aid of the given characteristics of the desired transmit pulse and of the determined oscillator control signal Φ. In act S16, the controller 6 checks whether the limitations for the base signal p* are maintained. If the limitations are maintained, the determination of the base signal p* and of the oscillator control signal Φ is terminated. In this case, the base signal p* and the oscillator control signal 1 may be output in act S17 by the controller 6. The controller 6 moves to act S18, in which the controller 6 varies the determined curve of the oscillator control signal Φ.

The reverse procedure may also be used. In other words, the base signal p* may be determined, the associated oscillator control signal Φ may be determined, and the determined oscillator control signal Φ may be checked for compliance of the given limitations.

Figure 9:
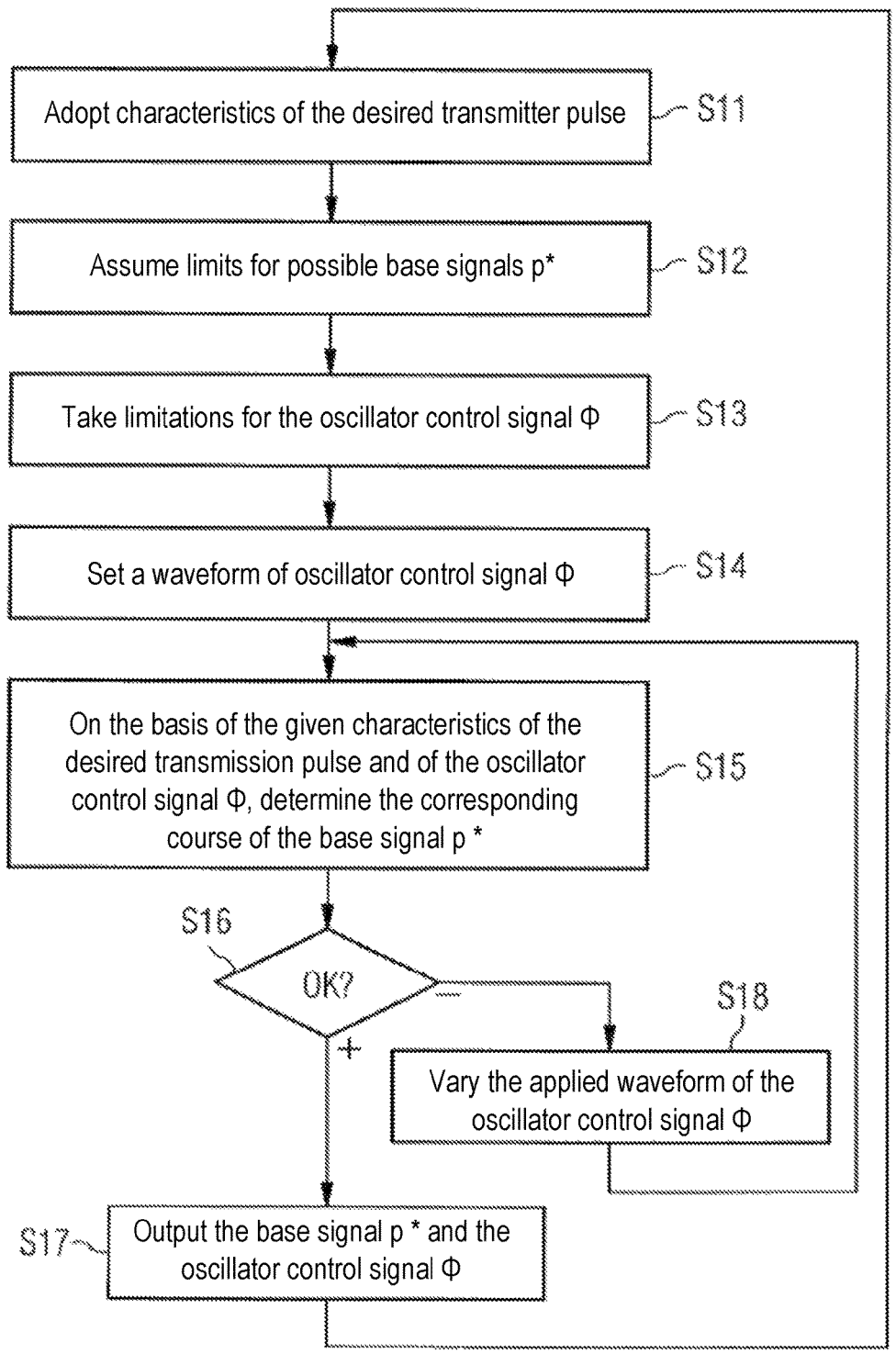
Figure 10:
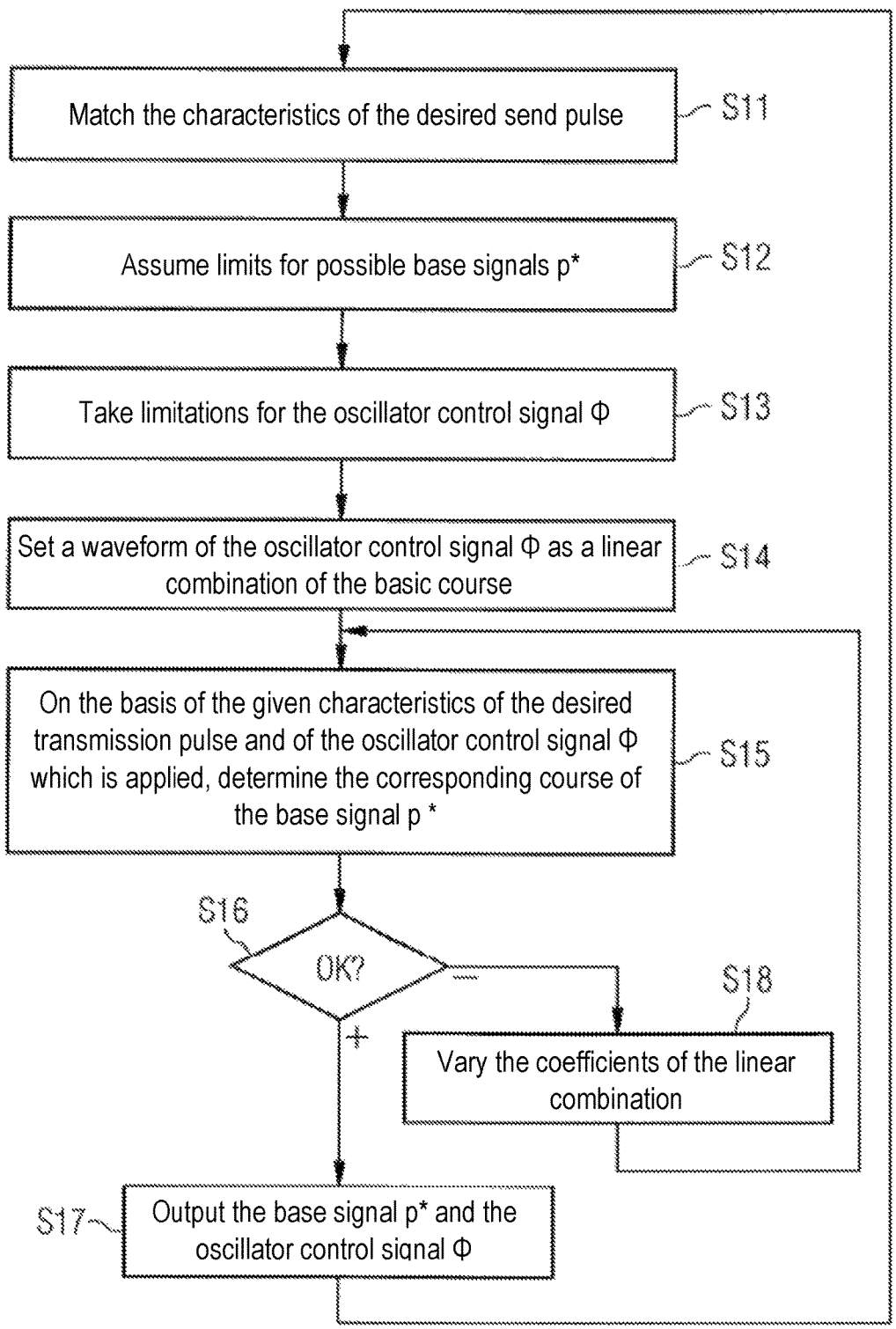

In the embodiment of the procedure in FIG. 9, the controller 6 may prespecify a set of basic curves (e.g., as Chebyshev polynomials of degree Grad 0, 1, . . . , n). In this case (see FIG. 10), acts S14 and S18 are modified such that the controller 6 in act S14 determines the curve of the oscillator control Φ as linear combinations of the basic curves and varies the coefficients of the linear combination in act S18.

Other procedures may also be used. For example, the controller 6 may divide the duration of the base signal p* into individual time segments. The minimum duration of an individual time segment and/or the maximum number of time segments is prespecified. The respective oscillator control signal Φ may, for example, be constant within each time segment, may vary maximally linearly, may vary maximally quadratically, or may vary maximally cubically. In the event of a linear curve, an additional condition may be defined as a continuous transition of the oscillator control signal Φ taking place from time segment to time segment. In the event of a cubic or higher curve, an additional condition may be defined, for example, such that a continuous and also differentiable transition of the oscillator control signal Φ takes place from time segment to time segment. A prespecification of other functions may also be provided (e.g., a prespecification of supporting points that define splines).

Figure 11:
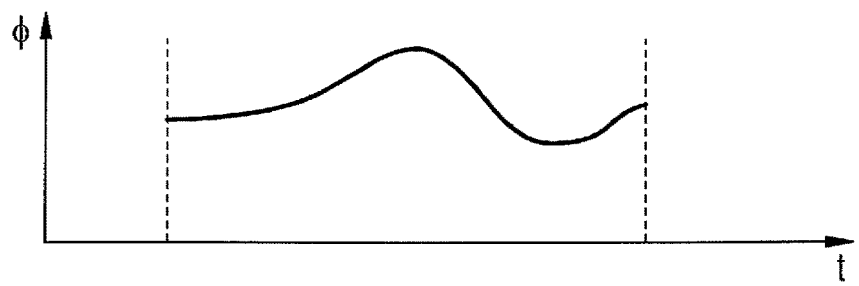
FIGS. 11 to 14 show exemplary time diagrams.

Different types of temporal curves of the oscillator control signal Φ may be used irrespective of whether the temporal curve of the oscillator control signal Φ of the controller 6 is specified or is determined. For example, the controller 6 may vary the oscillator control signal Φ according to FIGS. 4 and 6 and also to FIG. 11 both infinitely and continuously.

Figure 12:
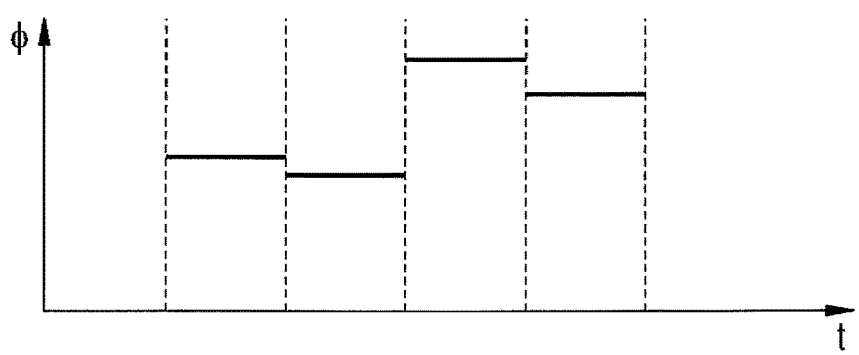

In one embodiment, the controller 6 may divide the curve of the oscillator of the oscillator control signal Φ according to FIG. 12 into time segments of a predetermined length or predetermined minimal length (e.g., the entire duration of the base signal p* into four equally sized segments or into a number of time segments, each of the time segments having at least 10% of the duration of the base signal p*). In this case, the controller 6 may determine a value for the oscillator control signal Φ for each time segment. The value of the oscillator control signal Φ may vary from time segment to time segment, but is kept constant within the respective time segment.

Figure 13:
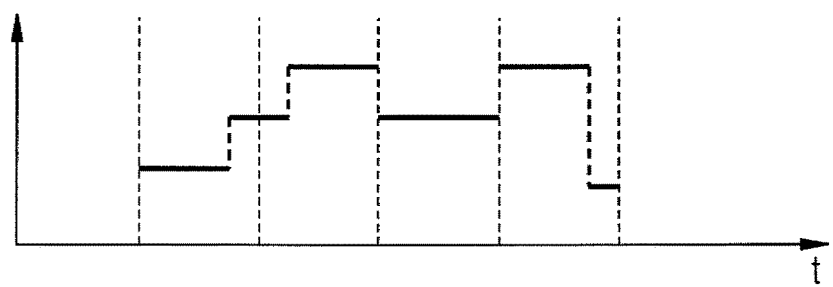
Figure 14:
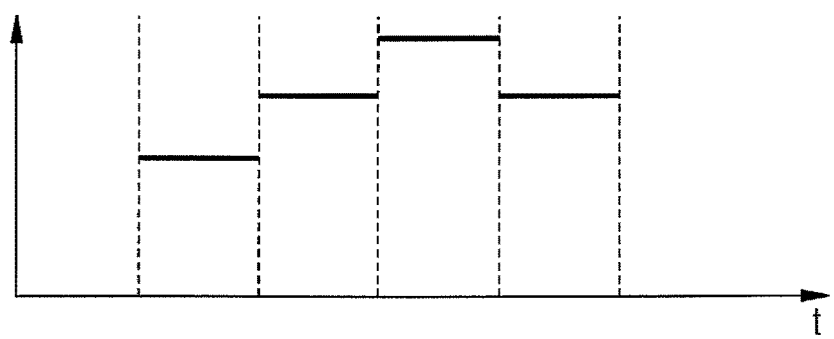

In another embodiment, in accordance with FIG. 13, the controller 6 may change the oscillator control signal Φ at any time. The possible/permissible values of the oscillator control signal Φ are graduated. Similarly (see FIG. 14), a temporal division into time segments may take place, and the oscillator control signal Φ may only be changed in stages.

The mode of operation of the magnetic resonance system is explained above for a single transmit channel. The mode of operation may similarly be applied to several transmit channels. If several transmit channels are available, the modulator 10 and the power amplifier 12 and/or, if necessary, the base controller 13 and the demodulator 14 are individually present for each transmit channel. The oscillator 11 may in some embodiments be the same for several transmit channels or for all transmit channels. Alternatively, the oscillator 11 may also be present individually for each transmit channel.

The present embodiments have many advantages. One advantage is that the bandwidth of the base signal p* is smaller than the bandwidth of the base pulse p' and/or of the transmit pulse P'. Transmit pulses P' with a relatively large bandwidth may be output in a controlled fashion to the magnetic resonance transmit antenna 4, even the controller bandwidth is relatively restricted. If the oscillator control signal Φ may be varied sufficiently quickly, even distortions that are caused by the power amplifier 12, may be precompensated. A further advantage is that a base signal p* with a negative amplitude may be provided (e.g., corresponding to a phase offset of 180°), and thus a further degree of freedom may be provided when determining the base signal p*.

Although the invention was illustrated and described in more detail by the preferred exemplary embodiment, the invention is not restricted by the disclosed examples. Other variations may be derived by the person skilled in the art without departing from the scope of protection of the invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method of operating a magnetic resonance system, the method comprising:
   outputting, by a controller, a base signal to a converter, the base signal having a low frequency;
   outputting, by the controller, an oscillator control signal to an oscillator when outputting, the base signal to the converter;
   generating by the oscillator, a frequency signal corresponding to the oscillator control signal and outputting the frequency signal to the converter, generating the frequency signal comprising controlling a frequency, a phase position, or the frequency and the phase position of the frequency signal;
   converting, by the converter, the frequency signal into a transmit pulse with the aid of the base signal and outputting the transmit pulse to a magnetic resonance transmit antenna, the transmit pulse having a high frequency;
   applying, with the magnetic resonance transmit antenna, a field corresponding to the transmit pulse to an examination volume of the magnetic resonance system, the field having a high frequency;
   receiving, by a magnetic resonance receive antenna, a signal from the examination volume as a result of the applied field corresponding to the transmit pulse; and
   generating an image based on the received signal;
   wherein the controller varies the oscillator control signal output to the oscillator when outputting the base signal to the converter, and
   wherein the transmit pulse has a larger bandwidth than the base signal.

2. The method as claimed in claim 1, further comprising:
   feeding the base signal and the frequency signal to a modulator within the converter;
   modulating, with the modulator, the frequency signal with the aid of the base signal to form a base pulse and outputting the base pulse within the converter to a power amplifier, the base pulse having a high frequency; and
   amplifying, with the power amplifier, the base pulse to the transmit pulse.

3. The method as claimed in claim 2, further comprising varying, with the controller, the oscillator control signal continuously or in stages, dividing the outputting of the base signal to the modulator into several time segments of a predetermined length or predetermined minimum length and varying the oscillator control signal from time segment to time segment with the oscillator remaining constant within the time segment, or a combination thereof.

4. The method as claimed in claim 2, further comprising:
   prespecifying characteristics of a desired transmit pulse and limitations for possible base signals, limitations for a curve of the oscillator control signal, or a combination thereof to the controller; and
   automatically determining, with the controller, the base signal and the curve of the oscillator control signal with the aid of the predetermined characteristics and the predetermined limitations for possible base signals, the limitations for the curve of the oscillator control signal, or the combination thereof.

5. The method as claimed in claim 2, further comprising:
   outputting, with the controller, the base signal as a target signal to a base controller;
   outputting, with the power amplifier, the transmit pulse to a demodulator and outputting the transmit pulse to the magnetic resonance transmit antenna;
   outputting, with the oscillator, the frequency signal to the demodulator and outputting the frequency signal to the modulator;
   demodulating, with the demodulator, the transmit pulse with the aid of the frequency signal to form a low frequency signal and outputting the low frequency signal as an actual signal to the base controller; and
   determining, with the base controller, a low frequency control signal to be output to the modulator with the aid of the target signal and the actual signal and outputting the low frequency control signal to the modulator.

6. The method as claimed in claim 5, further comprising:
   prespecifying characteristics of a desired transmit pulse and limitations for possible base signals, limitations for a curve of the oscillator control signal, or a combination thereof to the controller; and
   automatically determining, with the controller, the base signal and the curve of the oscillator control signal with the aid of the predetermined characteristics and the predetermined limitations for possible base signals, the limitations for the curve of the oscillator control signal, or the combination thereof.

7. The method as claimed in claim 5, further comprising varying, with the controller, the oscillator control signal continuously or in stages, dividing the outputting of the base signal to the modulator into several time segments of a predetermined length or predetermined minimum length and varying the oscillator control signal from time segment to time segment with the oscillator remaining constant within the time segment, or a combination thereof.

8. The method as claimed in claim 5, wherein the base controller has a controller bandwidth that is larger than a bandwidth of the base signal and smaller than a bandwidth of the transmit pulse.

9. The method as claimed in claim 8, further comprising:
prespecifying characteristics of a desired transmit pulse and limitations for possible base signals, limitations for a curve of the oscillator control signal, or a combination thereof to the controller; and
automatically determining, with the controller, the base signal and the curve of the oscillator control signal with the aid of the predetermined characteristics and the predetermined limitations for possible base signals, the limitations for the curve of the oscillator control signal, or the combination thereof.

10. The method as claimed in claim 8, further comprising varying, with the controller, the oscillator control signal continuously or in stages, dividing the outputting of the base signal to the modulator into several time segments of a predetermined length or predetermined minimum length and varying the oscillator control signal from time segment to time segment with the oscillator remaining constant within the time segment, or a combination thereof.

11. The method as claimed in claim 1, further comprising:
prespecifying characteristics of a desired transmit pulse and limitations for possible base signals, limitations for a curve of the oscillator control signal, or a combination thereof to the controller; and
automatically determining, with the controller, the base signal and the curve of the oscillator control signal with the aid of the predetermined characteristics and the predetermined limitations for possible base signals, the limitations for the curve of the oscillator control signal, or the combination thereof.

12. The method as claimed in claim 11, further comprising prespecifying a set of base curves of the oscillator control signal to the controller; and
determining, with the controller, the curve of the oscillator control signal as a linear Combination of the set of base curves.

13. In a non-transitory computer-readable storage medium that stores machine code executable by a controller for a magnetic resonance system to operate the magnetic resonance system, the machine code including instructions comprising:
outputting, by the controller, a base signal to a converter, the base signal having a low frequency;
outputting, by the controller, an oscillator control signal to an oscillator when outputting the base signal to the converter;
generating, by the controller, a frequency signal corresponding to the oscillator control signal and outputting the frequency signal to the converter, generating the frequency signal comprising controlling a frequency, a phase position, or the frequency and the phase position of the frequency signal;
converting, by the converter, the frequency signal into a transmit pulse with the aid of the base signal and outputting the transmit pulse to a magnetic resonance transmit antenna, the transmit pulse having a high frequency;
applying, with the magnetic resonance transmit antenna, a field corresponding to the transmit pulse to an examination volume of the magnetic resonance system, the field having a high frequency;
varying, with the controller, the oscillator control signal output to the oscillator when outputting the base signal to the converter;
receiving, by a magnetic resonance receive antenna, a signal from the examination volume as a result of the applied field corresponding to the transmit pulse; and
generating an image based on the received signal,
wherein the transmit pulse has a larger bandwidth than the base signal.

14. The non-transitory computer-readable storage medium as claimed in claim 13, wherein the instructions further comprise:
feeding the base signal and the frequency signal to a modulator within the converter;
modulating, with the modulator, the frequency signal with the aid of the base signal to form a base pulse and outputting the base pulse within the converter to a power amplifier, the base pulse having a high frequency; and
amplifying, with the power amplifier, the base pulse to the transmit pulse.

15. A controller for a magnetic resonance system, wherein the controller is configured to operate the magnetic resonance system, the controller being configured to:
output a base signal to a conversion device, the base signal having a low frequency;
output an oscillator control signal to an oscillator when outputting the base signal to the conversion device;
output a frequency signal corresponding to the oscillator control signal to the conversion device;
convert, with the conversion device, the frequency signal into a transmit pulse with the aid of the base signal and output the transmit pulse to a magnetic resonance transmit antenna, the transmit pulse having a high frequency;
apply, with the magnetic resonance transmit antenna, a field corresponding to the transmit pulse to an examination volume of the magnetic resonance system, the field having a high frequency; and
vary the oscillator control signal output to the oscillator when outputting the base signal to the conversion device,
wherein the transmit pulse has a larger bandwidth than the base signal.

16. A magnetic resonance system comprising:
at least one base magnet;
a controller; and
at least one transmit channel comprising at least one magnetic resonance transmit antenna, an oscillator, a power amplifier and a modulator,
wherein the controller is configured to:
output a base signal to a conversion device, the base signal having a low frequency;
output an oscillator control signal to an oscillator when outputting the base signal to the conversion device;
output, with the oscillator, a frequency signal corresponding to the oscillator control signal to the conversion device;

convert, with the conversion device, the frequency signal into a transmit pulse with the aid of the base signal and output the transmit pulse to the at least one magnetic resonance transmit antenna, the transmit pulse having a high frequency;

apply, with the at least one magnetic resonance transmit antenna, a field corresponding to the transmit pulse to an examination volume of the magnetic resonance system, the field having a high frequency; and vary the oscillator control signal output to the oscillator when outputting the base signal to the conversion device, wherein the transmit pulse has a larger bandwidth than the base signal.

* * * * *